United States Patent
Yang et al.

(10) Patent No.: US 7,100,125 B2
(45) Date of Patent: Aug. 29, 2006

(54) AGGRESSOR CLASSIFICATION METHOD FOR ANALYZING CROSSTALK OF CIRCUIT

(75) Inventors: Jae-Seok Yang, Yongin (KR); Jeong-Taek Kong, Seoul (KR); Moon-Hyun Yoo, Suwon (KR); Jeong-Yeol Kim, Suwon (KR); Joon-Ho Choi, Suwon (KR)

(73) Assignee: Samsung Electronics Co., Ltd., (KR)

( * ) Notice: Subject to any disclaimer, the term of this patent is extended or adjusted under 35 U.S.C. 154(b) by 361 days.

(21) Appl. No.: 10/457,243

(22) Filed: Jun. 8, 2003

(65) Prior Publication Data
US 2003/0229869 A1 Dec. 11, 2003

(30) Foreign Application Priority Data
Jun. 10, 2002 (FR) .................. 10-2002-0032341

(51) Int. Cl.
*G06F 17/50* (2006.01)
(52) U.S. Cl. .................. 716/1; 716/4; 716/5; 716/6
(58) Field of Classification Search .......... 716/2–8, 716/1, 10; 702/64–70; 703/2, 13–19
See application file for complete search history.

(56) References Cited

U.S. PATENT DOCUMENTS 6,353,917 B1 * 3/2002 Muddu et al. .................. 716/6
6,510,540 B1 * 1/2003 Krauter et al. .................. 716/4
6,651,229 B1 * 11/2003 Allen et al. .................. 716/6
6,836,873 B1 * 12/2004 Tseng et al. .................. 716/4
2003/0115563 A1 * 6/2003 Chen .................. 716/5

* cited by examiner

Primary Examiner—Vuthe Siek
Assistant Examiner—Nghia M. Doan
(74) Attorney, Agent, or Firm—F. Chau & Associates LLC (57) ABSTRACT

Functional and temporal aggressor classification methods that provide increased efficiency and accuracy for classifying aggressor signal lines of an integrated circuit for purposes of analyzing crosstalk of the circuit. In one aspect, an aggressor classification method for analyzing crosstalk of a circuit comprises (a) obtaining CNF (conjunction normal form) clauses of signal lines from a victim to a predetermined signal line and from an aggressor to a predetermined signal line for circuit analysis using a backward search, and obtaining CNF clauses of the victim and the aggressor, and summing up the CNF clauses of the victim and the aggressor to obtain a final CNF clause, (b) obtaining CNF clauses with respect to various cases in which logic values of the victims and aggressors are varied in the final CNF clause, and (c) analyzing the CNF clauses obtained in step (b) to classify aggressors as true or false aggressors, wherein an aggressor is classified as a true aggressor if a result of a given CNF clause has a vector, and classifying an aggressor as a false aggressor if a result of a given CNF clause has no vector.

12 Claims, 7 Drawing Sheets

AGGRESSOR CLASSIFICATION METHOD FOR ANALYZING CROSSTALK OF CIRCUIT

CROSS-REFERENCE TO RELATED APPLICATION

This application claims priority to Korean Patent Application No. 2002-32341, filed Jun. 10, 2002, which is hereby incorporated by reference in its entirety.

TECHNICAL FIELD OF THE INVENTION

The present invention relates generally to methods for analyzing crosstalk between signal lines of a semiconductor device and, in particular, to improved functional and temporal aggressor classification methods that provide increased efficiency and accuracy for classifying aggressor signal lines of an integrated circuit for purposes of analyzing crosstalk of the circuit.

BACKGROUND

As semiconductor devices become increasingly smaller and highly integrated, the line spacing between signal lines decreases, which causes an increase in the coupling capacitance between adjacent signal lines on a semiconductor device. Such coupling capacitance changes the delay time of a circuit and generates noise. Accordingly, methods for analyzing crosstalk between signal lines of a semiconductor device are very useful for determining if potential crosstalk problems exist before the device is actually fabricated. In this way, the circuit design can be modified or other actions can be taken, if necessary, with respect to signal lines that may provide potential crosstalk problems.

To analyze crosstalk of a circuit, signal lines are classified as either "aggressors" or "victims". The "aggressors" are further classified as either "true aggressors" (which influence the victims) or "false aggressors" (which do not influence the victims). There are two types of aggressor classification methods known in the art, referred to as a functional classification method and a temporal classification method.

With a conventional functional classification method, "aggressors" are classified as "true aggressor" or "false aggressors" depending on whether or not the logical status of signals of a victim and aggressor affects noise and delay time of signals of other signal lines. More specifically, "true aggressors" affect their corresponding "victims" in terms of noises and delay times based on logic status thereof, whereas "false aggressors" do not affect their corresponding "victims" as such. The conventional functional aggressor classification method has a disadvantage in that the classification process is time consuming because all aggressors are classified as true or false aggressor after all the aggressors in a circuit are backward searched.

With a conventional temporal classification method, all aggressors presented are classified by temporally overlapping when a signal is presented at a signal line of a victim and calculating a minimum signal transition time and a maximum signal transition time that signals of the aggressors and victims start to transition. With this method, every aggressor that is overlapped with a victim in timing are classified as "true aggressors". The conventional temporal aggressor classification method has a disadvantage in that there is a possibility of erroneously classifying an aggressor (which will not cause any problem in a circuit) as a true aggressor, because such method does not take into consideration possible temporal overlap between aggressors.

The present invention provides improved classification methods that provide solutions to the problems associated with conventional functional and temporal aggressor classification methods.

SUMMARY OF THE INVENTION

The present invention invention is directed to aggressor classification methods that provide improved efficiency and accuracy for analyzing crosstalk of a circuit, as compared to conventional methods. An aggressor classification method according to the invention reduces the time for performing aggressor classification by allowing a backward search for a partial circuit of an entire circuit. In addition, an aggressor classification method according to the invention allows searching for only those aggressors that may actually cause problems to signal lines in a circuit, and excludes from the classification analysis those aggressors that may not actually cause problems in a circuit.

In one embodiment of the invention, a functional aggressor classification method for analyzing crosstalk of a circuit comprises (a) obtaining CNF (conjunction normal form) clauses of signal lines from a victim to a predetermined signal line and from an aggressor to a predetermined signal line for circuit analysis using a backward search, and obtaining CNF clauses of the victim and the aggressor, and summing up the CNF clauses of the victim and the aggressor to obtain a final CNF clause, (b) obtaining CNF clauses with respect to various cases in which logic values of the victims and aggressors are varied in the final CNF clause, and (c) analyzing the CNF clauses obtained in step (b) to classify aggressors as true or false aggressors, wherein an aggressor is classified as a true aggressor if a result of a given CNF clause has a vector, and classifying an aggressor as a false aggressor if a result of a given CNF clause has no vector.

Preferably, in step (a), the CNF clause of the victim is obtained by summing the CNF clauses of signal lines from the victim to the predetermined signal line, and the CNF clause of the aggressor is obtained by summing the CNF clauses of signal lines from the aggressor to the predetermined signal line. The predetermined signal line is a common input signal line that is commonly input to the victim and the aggressor.

Furthermore, the step (c) of analyzing the CNF clauses preferably comprises obtaining a BDD (binary decision diagram) for the each of the CNF clauses obtained in step (b) and using a BDD to determine if a vector exists for a corresponding CNF clause.

In another embodiment of the invention, a temporal aggressor classification method for analyzing crosstalk of a circuit comprises (a) arranging a victim and associated aggressors in a circuit in timing windows by plotting minimum and maximum starting points of signal transitions of the victim and associated aggressors, (b) grouping the aggressors into groups of aggressors using the minimum starting point of the signal transition of the aggressors as a reference, and (c) determining which group of aggressors is capable of causing the greatest crosstalk to the victim, and classifying each aggressor within the determined group as true aggressors. Preferably, the determining step (c) comprises determining the group having a greatest coupling effect factor. Preferably, a group having aggressors that are all included in at least one other group are not considered in the determining step (c). Furthermore, the coupling effect factor of a given group is preferably determined by summing individual coupling effect factors of the aggressors in the given group and the coupling effect factor of an aggressor is determined by dividing a coupling capacitance between the aggressor and corresponding victim by a minimum slope of a signal of the aggressor.

In yet another embodiment of the invention, an aggressor classification method for analyzing crosstalk of a circuit is a combination of a functional classification method and a temporal classification method according to the invention.

These and other embodiments, aspects, objects, features and advantages of the present invention will be described or become apparent from the following detailed description of preferred embodiments, which is to be read in connection with the accompanying drawings.

DETAILED DESCRIPTION OF PREFERRED EMBODIMENTS OF THE INVENTION

Aggressor classification methods according to embodiments of the present invention for analyzing crosstalk of a circuit will now be described in detail with reference to the accompanying drawings. It is to be understood that the methods described herein in accordance with the present invention may be implemented in various forms of hardware, software, firmware, special purpose processors, or a combination thereof. Preferably, the present invention is implemented in software as an application comprising program instructions that are tangibly embodied on one or more program storage devices (e.g., magnetic floppy disk, RAM, CD ROM, ROM, etc.), and executable by any device or machine comprising suitable architecture. It is to be further understood that since the method steps depicted in the accompanying Figures are preferably implemented in software, the actual flow of the process steps may differ depending upon the manner in which the present invention is programmed. Given the teachings herein, one of ordinary skill in the related art will be able to contemplate these and similar implementations or configurations of the present invention.

Figure 1:
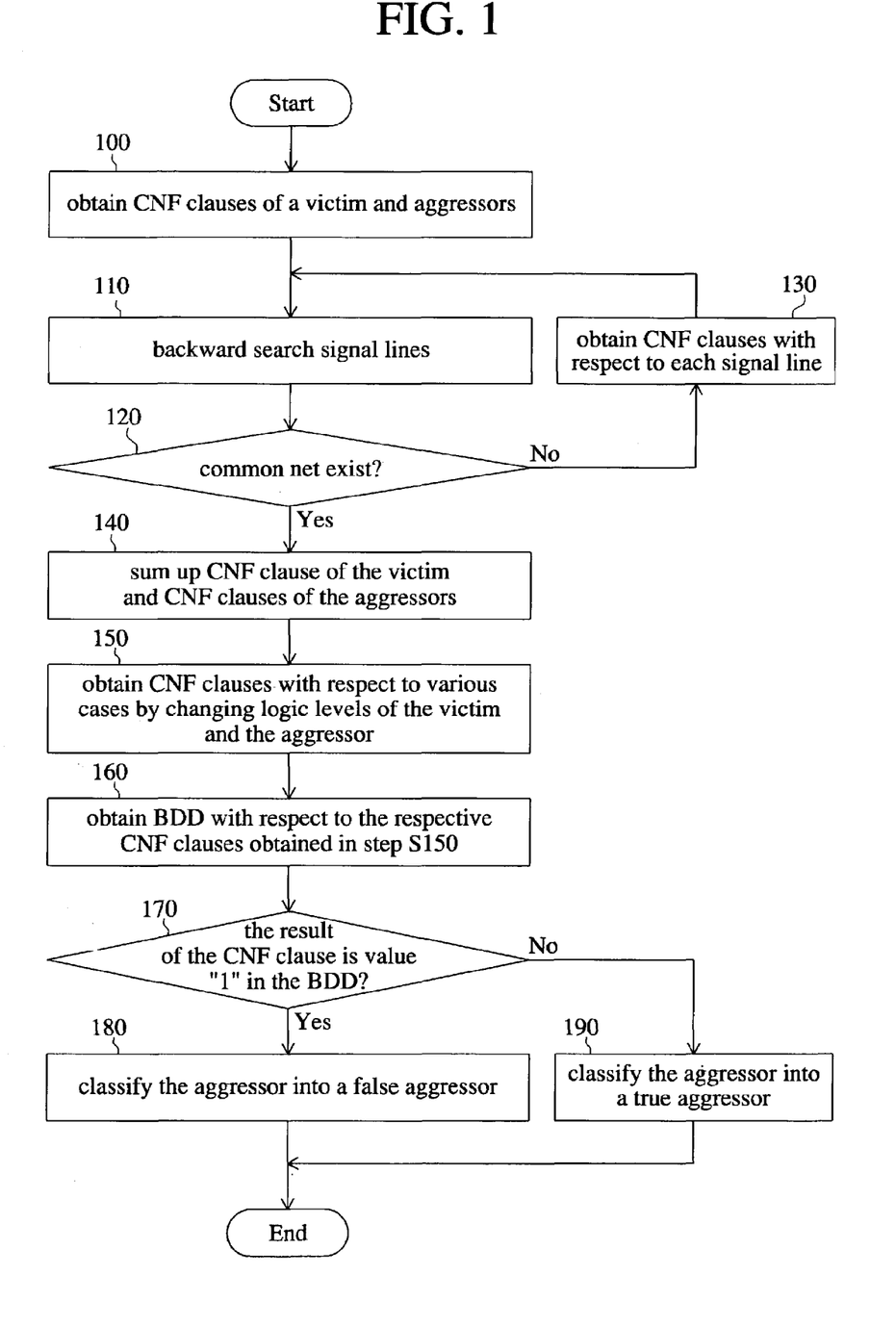
FIG. 1 is a flow chart illustrating a functional aggressor classification method for analyzing crosstalk of a circuit according to an embodiment of the present invention.

Referring now to FIG. 1, a flow diagram illustrates a functional aggressor classification method for analyzing crosstalk of a circuit according to an embodiment of the present invention. An initial step of the method is to obtain conjunction normal form (CNF) clauses of a victim and an aggressor (step 100).

By way of example, CNF clauses with respect to AND gates and OR gates are preferably obtained as follows. Assuming signals A and B are input to an AND gate and a signal Y is output from the AND gate, a CNF clause of the AND gate is obtained as $Y \oplus (A \cdot B) = 0$, where $\oplus$ denotes the exclusive OR operation and $\cdot$ denotes the AND operation.

Furthermore, assuming signals C and D are inputs to an OR gate and a signal Z is output from the OR gate, a CNF clause of an OR gate is obtained as $Z \oplus (A+B) = 0$, where $\oplus$ denotes the exclusive OR operation and + denotes the OR operation.

After the CNF clauses are obtained, a backward search is performed from signal lines for the victim and aggressor (step 110). Then, a determination is made as to whether a "common net" exists in signal lines between the victim and aggressor (step 120). A "common net" is defined as an input signal line that is commonly input to two or more circuits. Since signal conflicts are primarily caused in a common net, a backward search is preferably performed until a common net, if it exists, is found.

If no common net is found by the backward search (negative result in step 120), CNF clauses are obtained with respect to each signal line (step 130). An aggressor without a common net is classified as a "true aggressor" and a backward search is terminated with respect to the aggressor classified as a "true aggressor".

On the other hand, if it is determined that a common net exists by the backward search (affirmative determination in step 120), the CNF clauses obtained with respect to signal lines from the victim to the common net and the CNF clauses obtained with respect to signal lines from the aggressor to the common net are summed up (step 140).

Next, CNF clauses are obtained with respect to various cases in which the victim and the aggressor are simultaneously transited to the same logic level and to different logic levels (step 150). A binary decision diagram (BDD) is then generated (step 160) with respect to the CNF clauses obtained in step 150.

A determination is then made as to whether a result of a CNF clause is value "1" based on the reduced BDD (step 170). If a result of the CNF clause based on the reduced BDD is value "1" (affirmative determination in step 170), the aggressor is classified as a "false aggressor". More specifically, if a result of the CNF clause is the value "1" in accordance with the BDD, this means that a vector does not exist and such aggressor is classified as a "false aggressor". On the other hand, if a result of the CNF clause based on the reduced BDD is not value "1" (negative determination in step 170), the aggressor will be classified as a "true aggressor" (step 190).

Accordingly, as described above, it is to be appreciated that only those aggressors with a common net are subjected to an aggressor classification process in accordance with the invention. Advantageously, this results in a reduction in the time for the aggressor classification process. Further, the use of the CNF clause and BDD enables a classification process according to the invention to be performed fast and efficiently (which is to be contrasted with a conventional aggressor classification method that does not use the CNF clause and BDD).

Figure 2:
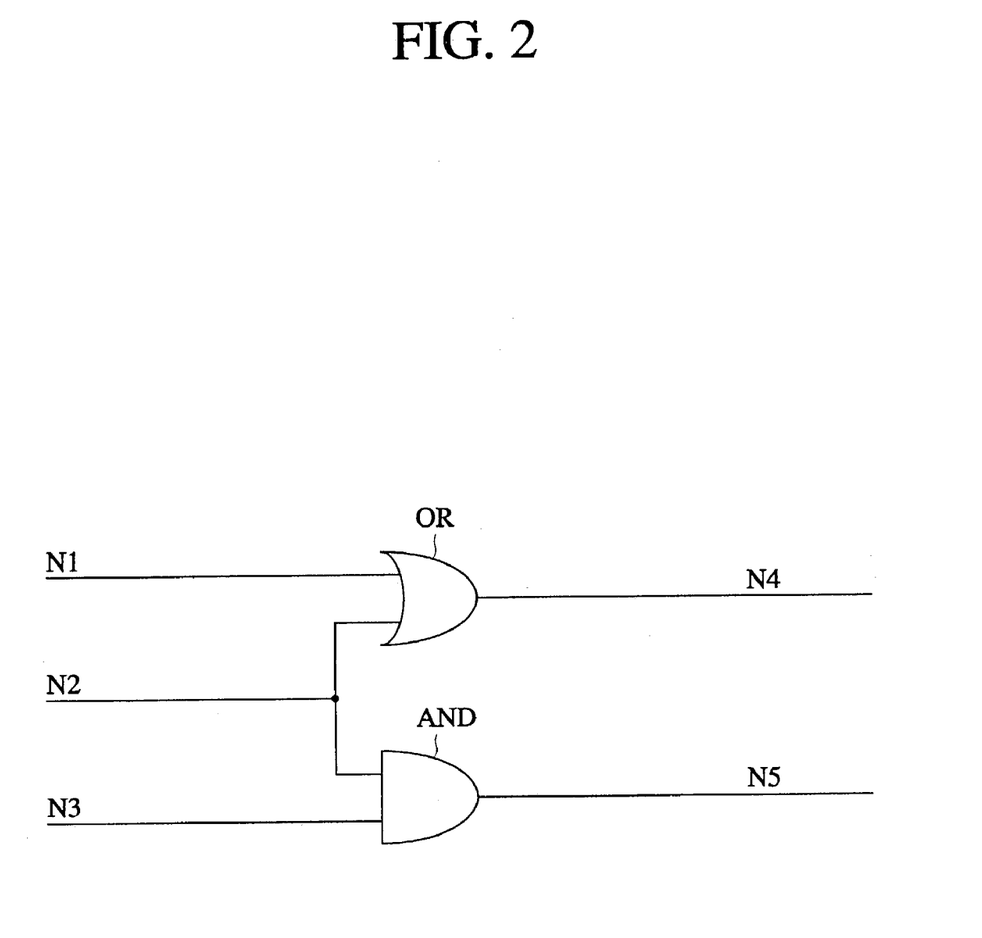
FIG. 2 is an exemplary circuit diagram that is analyzed using the functional aggressor classification method of FIG. 1 for purposes of illustrating such method.

The classification method of FIG. 1 will now be explained in further detail with reference to the exemplary circuit diagram of FIG. 2. In FIG. 2, a circuit includes an OR gate having an output connected to signal line N4, and an AND gate having an output connected to signal line N5. It is assumed that signal lines N4 and N5 are an aggressor and a victim, respectively.

Initially, in accordance with step 100 of the method shown in FIG. 1, a CNF clause of the victim N5 is $N5 \oplus (N2 \cdot N3)=0$ and a CNF clause of the aggressor N4 is $N4 \oplus (N1+N2)=0$. Further, N2 is determined to be a "common net" because N2 is a common input signal line connected to the OR gate and the AND gate. Accordingly, CNF clauses are obtained with respect to signal lines from the victim N5 to the common net N2 and CNF clauses are obtained with respect to signal lines from the aggressor N4 to the common net N2. Then, the obtained CNF clauses are summed up as follows:

$$F(N5, N4, N1, N2, N3)=N5 \oplus (N2 \cdot N3)+N4 \oplus (N1+N2)=0.$$

Then, in accordance with step 150 of FIG. 1, CNF clauses are obtained by changing logic levels of the victim and aggressor. For instance, if the victim N5 and the aggressor N4 are transited to different logic levels, CNF clauses are obtained as follows:

N5="0", N4="1" (a)

$$F(0,1, N1, N2, N3)=(N2 \cdot N3)+\overline{(N1+N2)}=0$$

N5="1", N4="0" (b)

$$F(1,0, N1, N2, N3)=\overline{(N2 \cdot N3)}+N1+N2=0$$

Furthermore, if the victim N5 and the aggressor N4 are transited to the same logic level, CNF clauses are obtained as follows:

N5="1", N4="1" (c)

$$F(1,1, N1, N2, N3)=\overline{(N2 \cdot N3)}+\overline{(N1+N2)}=0$$

N5="0", N4="0" (d)

$$F(0,0, N1, N2, N3)=(N2 \cdot N3)+(N1+N2)=0$$

After the above CNF clauses are obtained for each of the above cases (a), (b), (c) and (d), a BDD for each CNF clause is obtained (see step 160 of FIG. 1). In this example, the BDDs are shown in FIGS. 3A, 3B, 3C and 3D.

Figure 3A:
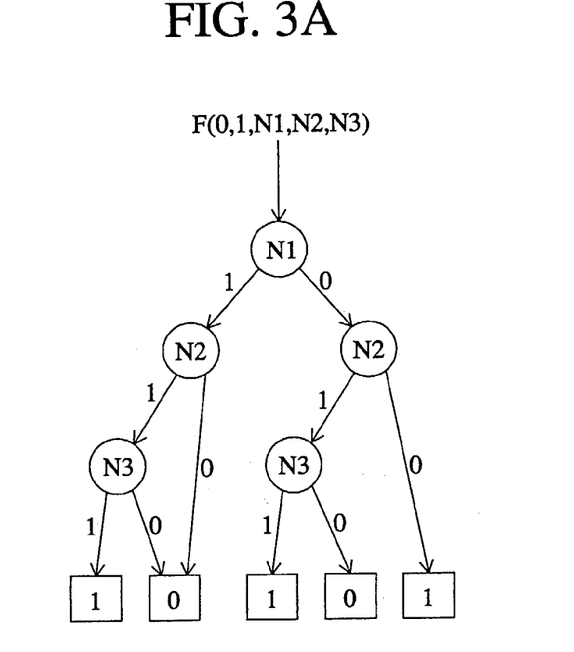
FIGS. 3A, 3B, 3C and 3D illustrate exemplary binary decision diagrams (BDDs) for conjunction normal form (CNF) clauses that are determined for the exemplary circuit of FIG. 2.

In particular, FIG. 3A illustrates a BDD that is obtained for the CNF clause in case (a). The BDD shows that a vector exists for the case (a). That is, assuming that N1=1, N2=1 and N3=0, a vector exists. Further, assuming that N1=1 and N2=0, a vector also exists. Still further, assuming that N1=0, N2=1 and N3=0, a vector exists.

Figure 3B:
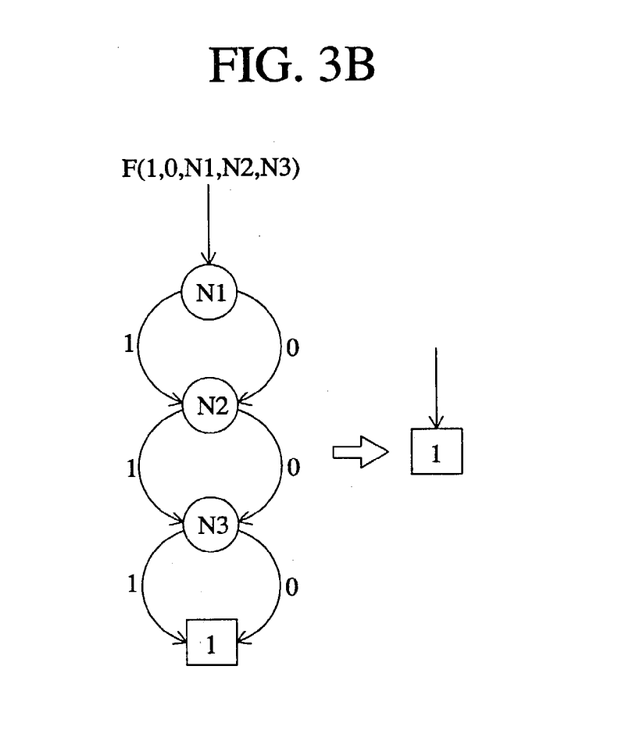

FIG. 3B illustrates a BDD that is obtained for the CNF clause in case (b). The BDD shows that a vector does not exist.

Figure 3C:
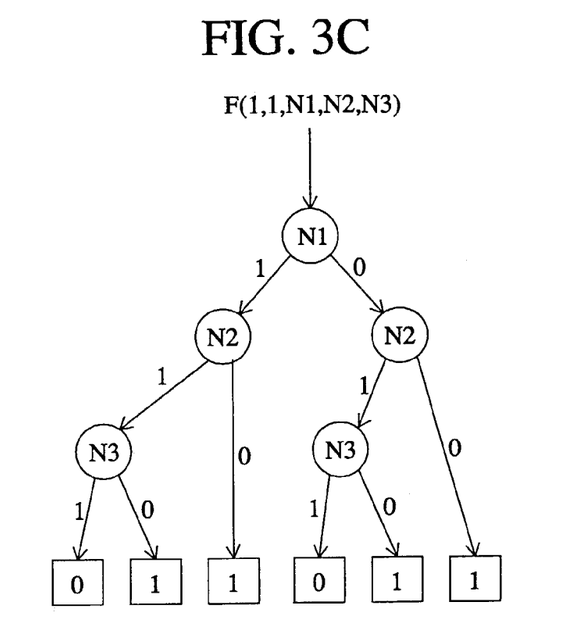

FIG. 3C illustrates a BDD that is obtained for the CNF clause in case (c). The BDD shows that vectors exist. More specifically, a vector exists for the case where N1=1, N2=1 and N3=1 and the case where N1=0, N2=1 and N3=1.

Figure 3D:
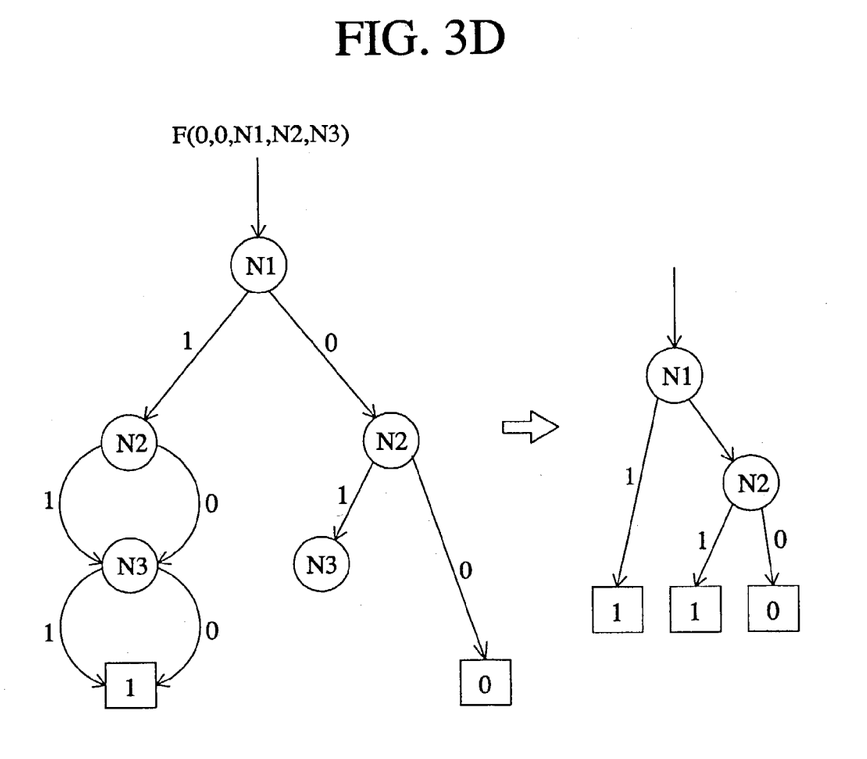

Further, FIG. 3D illustrates a BDD that is obtained for the CNF clause in case (d). The BDD shows that a vector exists for the case of N1=0 and N2=0.

Therefore, in the above example, when the victim signal line N5 transits from logic level "0" to logic level "1", and the aggressor signal line N4 transits from logic level "1" to logic level "0", a vector does not exist in the case (b). Accordingly, the signal line N4 is classified as a "false aggressor". On the other hand, when the signal line N5 has logic level "0" and the signal line N4 transits from logic level "0" to logic level "1", since vectors exist in the above cases (a) and (d), the signal line N4 is classified as a "true aggressor". Further, when the signal line N5 has logic level "1" and the aggressor signal line N4 transits from logic level "1" to logic level "0", no vector exist in the case (b), so that the signal line N4 is classified as a "false aggressor".

Accordingly, in accordance with a functional aggressor classification method of the present invention, only signal lines having a "common net" are subjected to the aggressor classification process, so that classification time is shortened.

Further, all the aggressors are not used to analyze crosstalk of a circuit, but rather only true aggressors that are capable of causing problems are used to analyze crosstalk by adapting CNF clauses and BDDs. Accordingly, the time for performing crosstalk analysis is also decreased.

In the embodiment described above with reference to FIGS. 1–3, the aggressor classification is performed with respect to the signal line from the victim to the common net. However, it is not necessary to classify aggressors only to the common net and the method may be implemented to classify aggressors by performing a backward search to a point to which a user wants to analyze for crosstalk.

Figure 4:
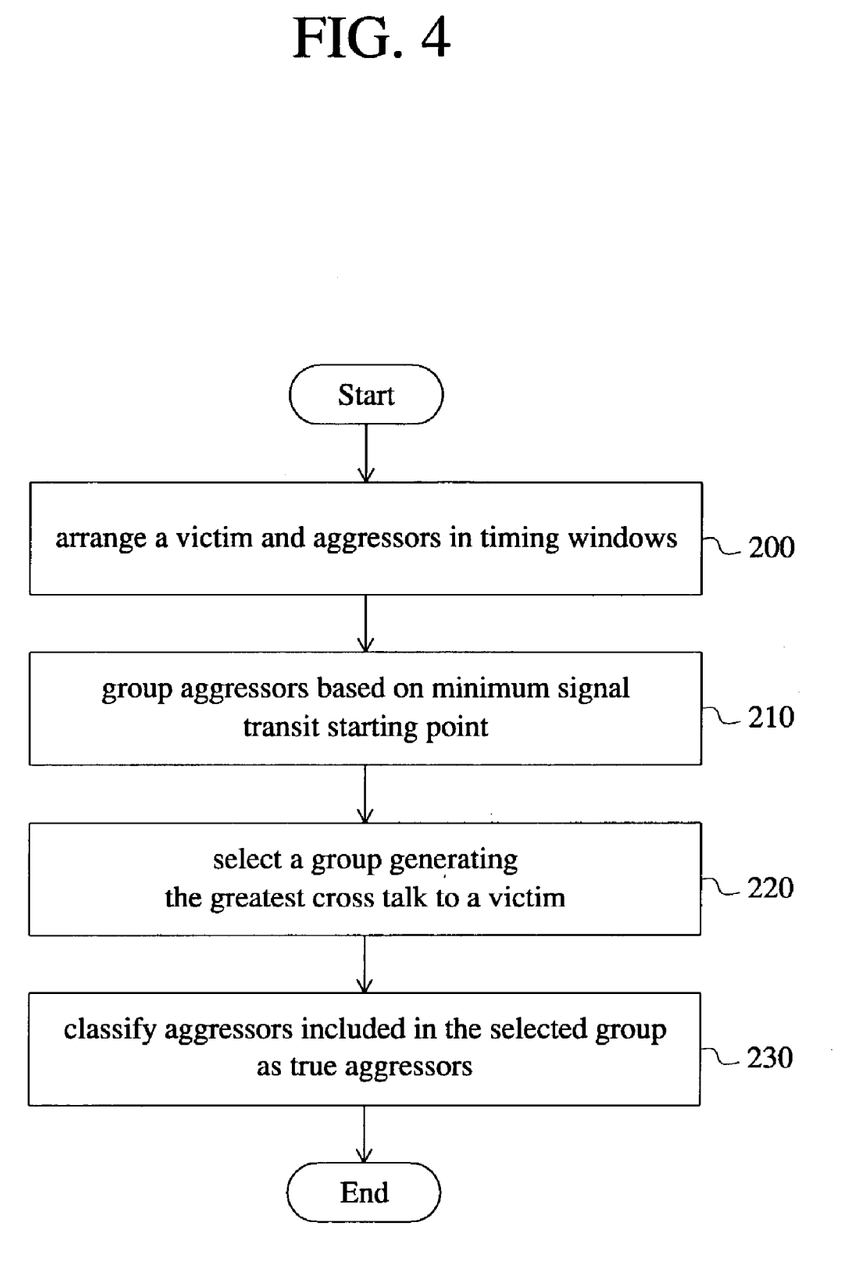
FIG. 4 is a flow chart illustrating a temporal aggressor classification method for analyzing crosstalk of a circuit according to an embodiment of the invention.

FIG. 4 is a flow diagram illustrating a temporal aggressor classification method according to an embodiment of the invention for analyzing crosstalk of a circuit. An initial step of the process is to arrange timing windows of each victim and aggressor (step 200). Since there may be a plurality of aggressors with respect to one victim, the minimum and maximum starting points of signal transition of the victim and the aggressors are plotted in the timing windows.

Next, the aggressors are grouped at the minimum starting point of the aggressors in each timing window (step 210). Then, a group of aggressors that is capable of causing the greatest crosstalk to the victim are selected from a plurality of aggressor groups (step 220). Preferably, the selection process is performed as follows. A "coupling effect factor" is determined by the equation: coupling effect factor=coupling capacitance between a victim and its aggressors/a minimum signal slope of a signal appeared at the aggressors. In particular, the "coupling effect factor" for each group of aggressors is determined by adding coupling effect factors of the aggressors in a group.

Each aggressor having no overlapped portion with a different aggressor is classified as a "false aggressor", without calculating coupling effect factors. Further, the coupling effect factors are not calculated for a group of aggressors that includes aggressors of different groups. Accordingly, this enables a decrease in the time for aggressor classification. Finally, only those aggressors of the selected groups are classified as true aggressors (step 230).

As noted above, in the conventional aggressor classification method, every aggressor that is overlapped with a victim in timing are classified as "true aggressors". In contrast, in accordance with a classification method of the present invention, the aggressors that are overlapped with a victim are divided into a plurality of groups, and then only those aggressors that are included in a group having the greatest coupling effect factor among the aggressor groups are classified as "true aggressors" (since these aggressor actually cause crosstalk in a circuit). Accordingly, the accuracy of the crosstalk analysis improved and circuit crosstalk analysis time is shortened, as compared to the conventional method.

Figure 5:
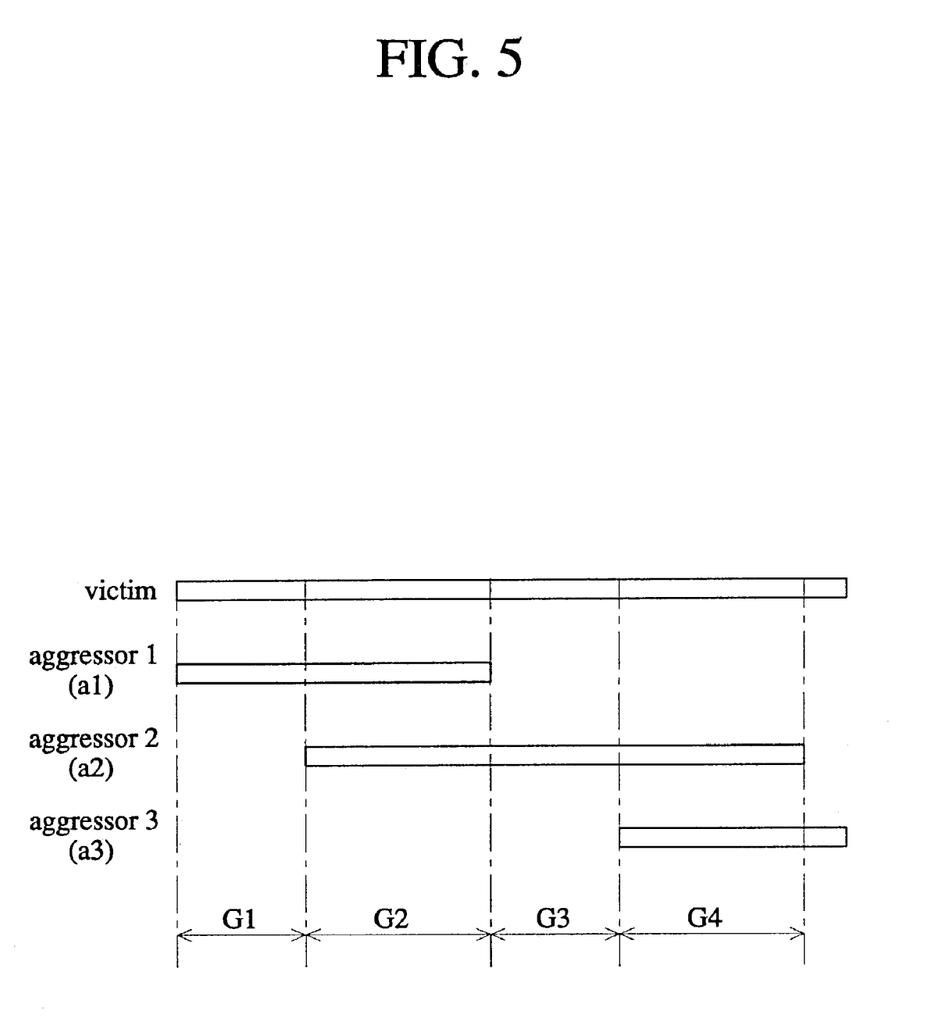
FIG. 5 depicts exemplary timing windows of a victim and aggressors, which are analyzed using a temporal aggressor classification method of FIG. 4 for purposes of illustrating such method.
Figure 6:
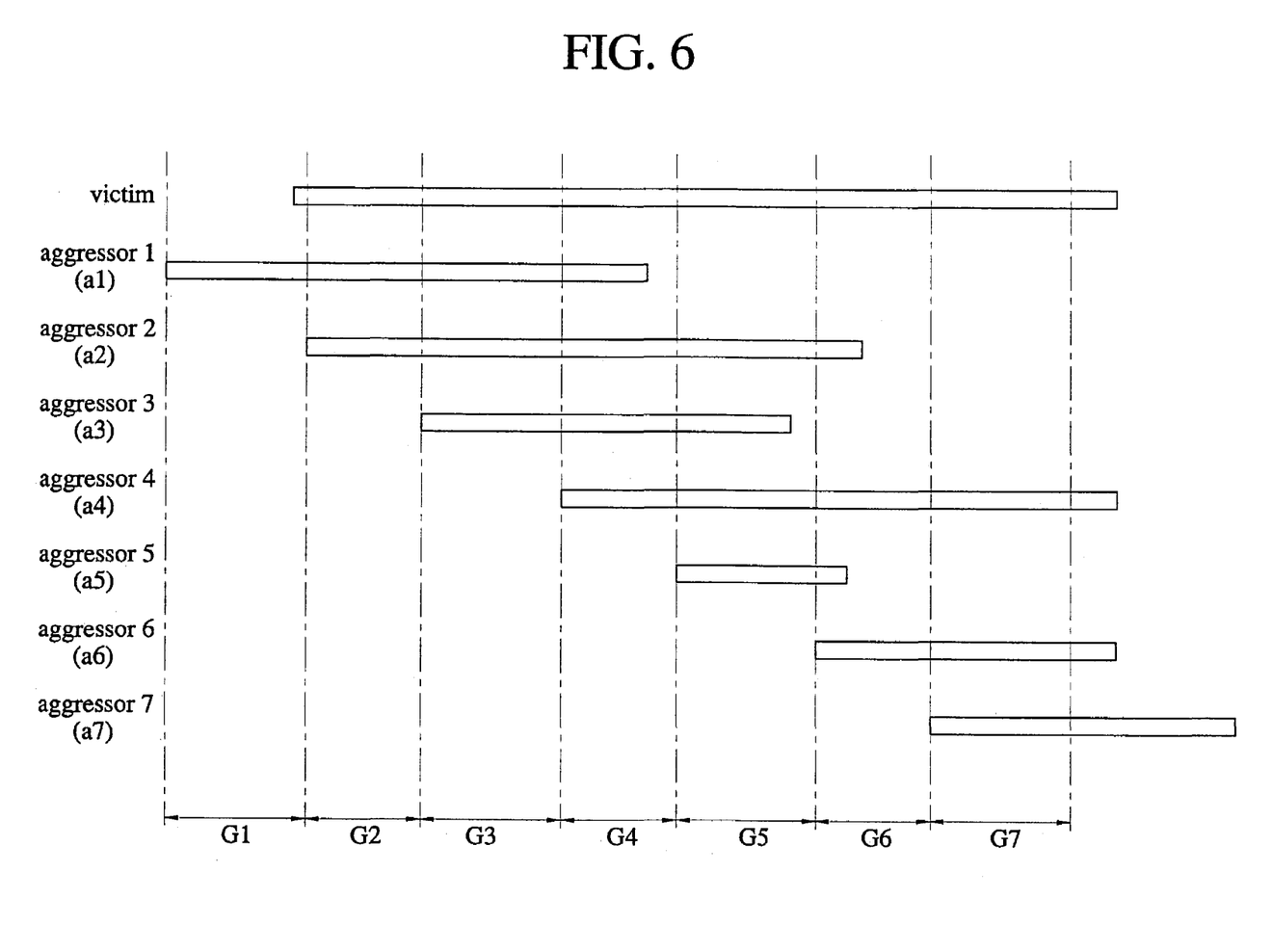
FIG. 6 depicts exemplary timing windows of a victim and aggressors, which are analyzed using a temporal aggressor classification method of FIG. 4 for purposes of illustrating such method.

The classification method of FIG. 4 will now be explained in further detail with reference to the exemplary timing windows of a victim and aggressors as depicted in FIGS. 5 and 6. Referring first to FIG. 5, when a victim and aggressors are arranged in timing windows, the aggressors are grouped based on minimum starting points of signal transition of the aggressors.

In the example of FIG. 5, the aggressors are divided into four groups G1, G2, G3 and G4. The group G1 comprises aggressor a1, the group G2 comprises aggressors a1 and a2, the group G3 comprises aggressor a3, and the group G4 comprises aggressors a2 and a3.

Among the groups G1, G2, G3 and G4, the group G1 is a subset of group G2 and group G3 is a subset of group G4. Accordingly, groups G1 and G3 are not considered in the classification process. As such, the group that is capable of causing the greatest crosstalk is selected from the remaining groups G2 and G4. For example, if the sum of coupling effect factors of the aggressors a1, a2 of group G2 is greater than sum of coupling effect factors of the aggressors a2, a3 of group G4, then aggressors a1, a2 of group G3 are classified as "true aggressors". Accordingly, the crosstalk analysis would be performed using only the aggressors a1, a2 in group G3.

Referring now to the example depicted in FIG. 6, with the victim and the aggressors arranged in the timing windows as shown, the aggressors are divided into seven groups G1, G2, G3, G4, G5, G6 and G7 based on minimum starting points of signal transits of the aggressors.

The group G1 comprises an aggressor a1. The group G2 comprises aggressors a1 and a2. The group G3 comprises aggressors a1, a2 and a3. The group G4 comprises aggressors a1, a2, a3 and a4. The group G5 comprises aggressors a2, a3, a4 and a5. The group G6 comprises aggressors a2, a4, a5 and a6. The group G7 comprises aggressors a4, a6 and a7.

Among the groups G1 to G7, the aggressors a1, a2 and a3 in the groups G1, G2 and G3 are included in the group G4. Accordingly, the groups G1, G2 and G3 are excluded from the aggressor classification process, so that coupling effect factors of the groups G1, G2 and G3 are not calculated. The coupling effect factors of the remaining groups G4–G7 are obtained, and then each aggressor in the group having the greatest coupling effect factor is classified as a "true aggressor". For example, assuming that group G5 has the greatest coupling effect factor, the aggressors a2, a3, a4 and a5 (which are included in group G5) are classified as "true aggressors".

Therefore, in accordance with a temporal aggressor classification method of the present invention, aggressors are first grouped using minimum starting points of signal transition as a reference for grouping, the aggressor group that causes the greatest crosstalk in a circuit is then selected, and the aggressors of the selected aggressor group are classified as "true aggressors". Advantageously, a temporal classification process of the invention excludes from the aggressor classification process at the outset, those aggressors that do not cause crosstalk in a circuit, so that crosstalk in a circuit may be efficiently and accurately analyzed.

It is to be understood that an aggressor classification method according to the present invention may comprise a functional classification method or a temporal classification method as discussed above, or a combination of such functional and temporal classification methods, for performing crosstalk analysis.

In summary, with a classification method according to the invention, only those aggressors with common nets are classified by backward search in the classification process, whereas aggressors without common nets are excluded from the subject of the aggressor classification process, so that classification time is shortened.

Further, a functional aggressor classification method and temporal aggressor classification method of the present invention preferably uses CNF clauses and BDDs to thereby efficiently and accurately extract the aggressors that are capable of actually causing crosstalk in a circuit.

Furthermore, since only those coupling capacitances that are capable of affecting aggressors are considered in crosstalk analysis of a circuit, the accuracy of an aggressor classification and circuit analysis is improved and time for aggressor classification and circuit analysis is shortened.

Although illustrative embodiments have been described herein with reference to the accompanying drawings, it is to be understood that the invention is not limited to those precise embodiments, and that various other changes and modifications may be effected therein by one of ordinary skill in the art without departing from the scope or spirit of the invention. All such changes and modifications are intended to be included within the scope of the invention as defined by the appended claims.

What is claimed is:

1. A method for classifying aggressors for analyzing crosstalk of a circuit, comprising the steps of:
    (a) obtaining CNF (conjunction normal form) clauses of signal lines from a victim to a predetermined signal line and from an aggressor to the predetermined signal line for circuit analysis using a backward search, and obtaining CNF clauses of the victim and the aggressor, and summing up the CNF clauses of the victim and the aggressor to obtain a final CNF clause;
    (b) obtaining CNF clauses with respect to various cases in which logic values of the victims and aggressors are varied in the final CNF clause; and
    (c) analyzing the CNF clauses obtained in step (b) to classify aggressors as true or false aggressors, wherein an aggressor is classified as a true aggressor if a result of a given CNF clause has a vector, and classifying an aggressor as a false aggressor if a result of a given CNF clause has no vector,
    wherein the predetermined signal line is a common input signal line that is commonly input to the victim and the aggressor.

2. The method according to claim 1, wherein in step (a), the CNF clause of the victim is obtained by summing the CNF clauses of signal lines from the victim to the predetermined signal line, and the CNF clause of the aggressor is obtained by summing the CNF clauses of signal lines from the aggressor to the predetermined signal line.

3. The method according to claim 1, wherein the step (c) of analyzing the CNF clauses comprises obtaining a BDD (binary decision diagram) for the each of the CNF clauses obtained in step (b) and using a BDD to determine if a vector exists for a corresponding CNF clause.

4. A method for classifying aggressors for analyzing crosstalk of a circuit, comprising the steps of:
    performing a functional classification method comprising:
        (a) obtaining CNF (conjunction normal form) clauses of signal lines from a victim to a predetermined signal line and from an aggressor to the predetermined signal line for circuit analysis using a backward search, and obtaining CNF clauses of the victim and the aggressor, and summing up the CNF clauses of the victim and the aggressor to obtain a final CNF clause, wherein the predetermined signal line is a common input signal line that is commonly input to the victim and the aggressor;

(b) obtaining CNF clauses with respect to various cases in which logic values of the victims and aggressors are varied in the final CNF clause; and (c) analyzing the CNF clauses obtained in step (b) to classify aggressors as true or false aggressors, wherein an aggressor is classified as a true aggressor if a result of a given CNF clause has a vector, and classifying an aggressor as a false aggressor if a result of a given CNF clause has no vector; and performing a temporal classification method comprising:

(d) arranging a victim and associated aggressors in a circuit in timing windows by plotting minimum and maximum starting points of signal transitions of the victim and associated aggressors;

(e) grouping the aggressors into groups of aggressors using the minimum starting point of the signal transition of the aggressors as a reference; and (f) determining which group of aggressors causes the greatest crosstalk to the victim, and classifying each aggressor within the determined group as true aggressors.

5. The method according to claim 4, wherein in step (a), the CNF clause of the victim is obtained by summing the CNF clauses of signal lines from the victim to the predetermined signal line, and the CNF clause of the aggressor is obtained by summing the CNF clauses of signal lines from the aggressor to the predetermined signal line.

6. The method according to claim 4, wherein the step (c) of analyzing the CNF clauses comprises obtaining a BDD (binary decision diagram) for the each of the CNF clauses obtained in step (b) and using a BDD to determine if a vector exists for a corresponding CNF clause.

7. The method according to claim 4, comprising the step of excluding from the determining step (f), a group having aggressors that are all included in at least one other group.

8. The method according to claim 4, wherein the determining step (f) comprises determining the group having a greatest coupling effect factor.

9. The method according to claim 8, wherein the coupling effect factor of a given group is determined by summing individual coupling effect factors of aggressors in the given group.

10. The method according to claim 9, wherein the coupling effect factor of an aggressor is determined by dividing a coupling capacitance between the aggressor and corresponding victim by a minimum slope of a signal of the aggressor.

11. A program storage device readable by a machine, tangibly embodying a program of instructions executable by the machine to perform method steps for classifying aggressors for analyzing crosstalk of a circuit, the method steps comprising:

(a) obtaining CNF (conjunction normal form) clauses of signal lines from a victim to a predetermined signal line and from an aggressor to the predetermined signal line for circuit analysis using a backward search, and obtaining CNF clauses of the victim and the aggressor, and summing up the CNF clauses of the victim and the aggressor to obtain a final CNF clause;

(b) obtaining CNF clauses with respect to various cases in which logic values of the victims and aggressors are varied in the final CNF clause; and (c) analyzing the CNF clauses obtained in step (b) to classify aggressors as true or false aggressors, wherein an aggressor is classified as a true aggressor if a result of a given CNF clause has a vector, and classifying an aggressor as a false aggressor if a result of a given CNF clause has no vector, wherein the predetermined signal line is a common input signal line that is commonly input to the victim and the aggressor.

12. The program storage device of claim 11, further comprising instructions for performing the steps of:

(d) arranging a victim and associated aggressors in a circuit in timing windows by plotting minimum and maximum starting points of signal transitions of the victim and associated aggressors;

(e) grouping the aggressors into groups of aggressors using the minimum starting point of the signal transition of the aggressors as a reference; and (f) determining which group of aggressors causes the greatest crosstalk to the victim, and classifying each aggressor within the determined group as true aggressors.

* * * * *